(12) United States Patent
Honkura et al.

(10) Patent No.: US 8,461,834 B2
(45) Date of Patent: Jun. 11, 2013

(54) MAGNETO-IMPEDANCE SENSOR ELEMENT AND METHOD FOR MANUFACTURING THE SAME

(75) Inventors: Yoshinobu Honkura, Tokai (JP); Michiharu Yamamoto, Tokai (JP); Katsuhiko Nishihata, Tokai (JP)

(73) Assignee: Aichi Steel Corporation, Tokai-shi (JP)

( * ) Notice: Subject to any disclaimer, the term of this patent is extended or adjusted under 35 U.S.C. 154(b) by 0 days.

(21) Appl. No.: 13/147,385

(22) PCT Filed: Feb. 27, 2009

(86) PCT No.: PCT/JP2009/053642
§ 371 (c)(1),
(2), (4) Date: Aug. 2, 2011

(87) PCT Pub. No.: WO2010/097932
PCT Pub. Date: Sep. 2, 2010

(65) Prior Publication Data
US 2011/0291649 A1    Dec. 1, 2011

(51) Int. Cl.
*G01R 33/02* (2006.01)
(52) U.S. Cl.
USPC ........... 324/244; 324/210; 324/212; 324/250; 360/31; 360/46; 360/55; 257/427; 257/E29.323
(58) Field of Classification Search
USPC ........... 324/210, 212, 214, 244, 250; 360/31, 360/46, 55, 313, 324; 257/427, E29.323
See application file for complete search history.

(56) References Cited

U.S. PATENT DOCUMENTS

| | | | |
|---|---|---|---|
| 6,069,475 A | 5/2000 | Isomura et al. | |
| 6,229,307 B1 * | 5/2001 | Umehara et al. | 324/249 |
| 6,255,813 B1 * | 7/2001 | Isomura et al. | 324/249 |
| 6,472,868 B1 | 10/2002 | Takayama et al. | |
| 7,145,331 B2 * | 12/2006 | Kuroe et al. | 324/249 |
| 2001/0030537 A1 | 10/2001 | Honkura et al. | |
| 2005/0116708 A1 | 6/2005 | Honkura et al. | |
| 2005/0242805 A1 * | 11/2005 | Honkura et al. | 324/249 |
| 2011/0089512 A1 | 4/2011 | Honkura et al. | |

FOREIGN PATENT DOCUMENTS

| | | |
|---|---|---|
| JP | 10 10215 | 1/1998 |
| JP | 10 90381 | 4/1998 |
| JP | 2000 55996 | 2/2000 |
| JP | 2000 292506 | 10/2000 |
| JP | 2001 296127 | 10/2001 |
| JP | 2002 270918 | 9/2002 |
| WO | 03 071299 | 8/2003 |

\* cited by examiner

OTHER PUBLICATIONS

International Search Report issued May 19, 2009 in PCT/JP09/53642 filed Feb. 27, 2009.

*Primary Examiner* — Huy Q Phan
*Assistant Examiner* — Thang Le
(74) *Attorney, Agent, or Firm* — Oblon, Spivak, McClelland, Maier & Neustadt, L.L.P.

(57) ABSTRACT

A magneto-impedance sensor element is formed in a planar type structure in which an amorphous wire is incorporated in a substrate. The magneto-impedance sensor element includes a nonmagnetic substrate, an amorphous wire arranged in an aligning direction of a planar pattern that forms a detecting coil, a spiral detecting coil formed of a planar pattern and a cubic pattern on an outer periphery of the amorphous wire, a planar insulating portion that insulates the planar pattern from the amorphous wire, a wire fixing portion to fix the amorphous wire on an upper surface of the planar insulating portion, and a cubic insulating portion that insulates the cubic pattern from the amorphous wire.

6 Claims, 11 Drawing Sheets

(a)

(b)

Conventional Example

Conventional Example

Conventional Example

US 8,461,834 B2

MAGNETO-IMPEDANCE SENSOR ELEMENT AND METHOD FOR MANUFACTURING THE SAME

TECHNICAL FIELD

The present invention relates to reduction in size and thickness of a magneto-impedance sensor element (to be referred to as an MI element hereinafter) which incorporates an amorphous wire and is used in a magnetic sensor.

BACKGROUND ART

FIG. 12 shows a structure of a conventional MI element (Patent Document 1).

In an MI element 9, an amorphous wire 92 is fixed to a center portion on a substrate 91, and a detecting coil 93 is wound around a periphery of the substrate. An amorphous wire having a length of 4 mm and a diameter of 30 μm is used as the amorphous wire 92, and a width of 3 mm, a height of 2 mm, and a length of 4 mm are generally set as dimensions of the MI element.

When the conventional MI element is applied as a magnetic sensor, the MI element achieves high sensitivity and a size-reduction to some extent. However, the MI element is not always sufficient as a high-performance magnetic sensor (to be referred to as an MI sensor hereinafter).

Since an amorphous wire serving as a magnetic core of an MI element is crystallized in solder connection by heating, electrical connection by ultrasonic bonding or the like is performed between both the ends of the amorphous wire and electrodes. Since both the ends of the amorphous wire require the electrical connecting portions, the amorphous wire becomes long.

Since the magnetic characteristics of the amorphous wire are easily influenced by distortion due to the external stress, the amorphous wire is covered with a gelatinous material. A detecting coil becomes thick because the coil has a structure in which the amorphous wire covered with the gelatinous material on a substrate and the substrate are wound outer peripherally.

For this reason, the MI element has a large size, and is difficult to be reduced in size.

Patent Document 1: Japanese Unexamined Patent Publication No. 2001-296127

In order to reduce the size of an MI element, an amorphous wire itself needs to be shortened, and a detecting coil needs to be wound only around an amorphous wire without outer peripheral winding of a substrate. However, a stress-free amorphous wire is difficult to be arranged on a detecting coil pattern on the substrate. When stress acts on an amorphous wire, the magnetic characteristics of the amorphous wire are influenced, and an MI effect cannot be sufficiently exerted. For this reason, the reliability of an MI element is deteriorated.

Thus, when a groove is formed in the substrate to bury an amorphous wire in the groove, any stress does not act on the amorphous wire, and a reliable MI element is expected.

FIGS. 13 and 14 show a structure (recessed type) of a groove type MI element (Patent Document 2).

A groove type MI element obtained by microfabrication achieves a considerable size-reduction of the conventional MI element. In the structure, an extending groove 11 (recessed shape) is formed in a certain direction on a substrate 1 by a cutting process, an amorphous wire 2, an insulator 4, and a first detecting coil unit 31 are buried in the extending groove, and a second detecting coil unit 32 is formed on a groove upper surface 112. In this manner, an amorphous wire having a length of 1.5 mm and a diameter of 30 μm is used as the amorphous wire 2, and dimensions of the substrate 1 are a width of 0.5 mm, a thickness (height) of 0.5 mm, and a length of 1.5 mm. The groove on the substrate has a depth of 0.05 mm and a width of 0.07 mm.

However, since an extending groove forming is performed in the substrate, the MI element having the groove type structure (recessed type) may be damaged in the extending groove forming. A current amorphous wire has 30 μm, and an output from a detecting coil increases when the detecting coil is proximally wound as much as possible. For this reason, the width of a blade for forming the groove is preferably close to 30 μm as much as possible.

However, the width of a normal blade used in forming the groove of ceramic is 100 μm or more. A size smaller than 100 μm is a special size, and 50 μm is a minimum grade. For this reason, in the current process, a groove is formed with a blade having a width of a minimum grade of 50 to 70 μm. However, when the blade width decreases, the blade may be worn out and damaged.

In particular, at a wafer serving as a base material of a substrate on which a wire is mounted, if a widely-used alumina ceramic substrate is used, and the groove is formed at a processing speed on industrial standards with the blade having the above width, both the blade and the wafer are cracked.

For this reason, in order to process the wafer without being cracked, the wafer needs to be slowly processed regardless of productivity. Therefore, in fact, a machinable ceramic softer than normal alumina must be used as a material of a ceramic substrate for a wafer.

A groove depth minimally requires a depth obtained by adding about 15 μm to a wire diameter to cover the wire with an insulating layer and a coil, and a groove depth requires about 50 μm when a 30 μm-wire is used. In a groove structure having a groove width of 50 μm and a groove depth of 50 μm, a thickness of an entire substrate requires about 0.6 mm to prevent the substrate from being cracked by a groove. The reason of the requirement is that a current product uses machinable ceramic having good processability and low strength. Even though the machinable ceramic is used, a groove-forming blade is rapidly worn out because a blade width of the groove-forming blade is narrow. This resulted in increase of a cost In addition, when the groove depth of the substrate is deepened to 50 μm or more, a notch effect of the groove to the substrate becomes large to deteriorate substrate strength, and the substrate needs to be increased in thickness and size.

More specifically, when a groove structure of a 30-μm-diameter wire are used, the groove structure has a groove width ranging from 50 to 70 μm, a groove depth of 50 μm, and a substrate thickness of 0.6 mm, and it is optimized in terms of an output characteristic and a reduction in size.

In the extending groove structure, the groove structure is tried to be reduced in size to further reduce an entire element in size. However, the size reduction of the groove structure is difficult because the groove width cannot be 50 μm or less due to a limitation of the size of the blade.

Even if the groove width is fixed to 50 μm, a groove depth may be reduced by narrowing a wire diameter to reduce a notch effect and allow a substrate to be thinner.

In a groove structure, a detecting coil is formed along a groove. For this reason, even though a wire diameter is small, a detecting coil has 50 μm in a groove width direction and a wire diameter+about 15 μm in a depth direction because a groove width is fixed. When the wire diameter decreases, a proximal winding cannot be obtained. For this reason, an output characteristic of an MI element reduces considerably more than a reduction in diameter because a wire diameter reduces to relatively separate the detecting coil from a wire diameter.

When the wire diameter is small with reference to a groove width, a wire is difficult to be located at the center of a detecting coil. For this reason, an output characteristic fluctuates due to a fluctuation in wire position.

Furthermore, the machinable ceramic is difficult to be thinly processed in a depth direction, and a processing speed needs to be slow, so that an edge of the blade is intensively worn out. For this reason, a groove shape in a wafer fluctuates. When an insulating layer made of a resin or the like is supplied on the basis of the same shape, a problem such that the resin overflows the groove is posed, and the productivity is seriously deteriorated.

As described above, a reduction in size, especially, a reduction in thickness of the substrate cannot easily be achieved while satisfying both retention of strength during such as in processing and assembling an MI element in a substrate groove in this groove structure scheme, and maintenance of the output characteristic of the MI element.

A material of the substrate is limited to a material having good cutting performance such as a machinable ceramic to form an extending groove, and a size of a wafer used is also limited.

Patent Document 2: Domestic Re-publication of PCT International Publication for Patent Application: WO2003/071299

On the other hand, an MI element formed of an amorphous wire is not suitable for microfabrication. An ultra-compact magnetic detecting element is difficult to be formed because coil winding and amounting will be cumbersome. For this reason, an MI element in which a thin-film magnetic core is formed on a substrate is proposed (Patent Document 3 and Patent Document 4).

The thin film magnetic core itself will not be a stress since the core is formed of a sputtering film on the substrate. Therefore, the MI element formed of a thin film magnetic core is easily arranged.

However, in comparison with an MI element using an amorphous wire having a circular sectional shape, the MI element using a thin film magnetic core having a rectangular film shape in cross section cannot sufficiently exert a magnetic impedance effect in a width direction of the rectangular film.

Patent Document 3: Japanese Unexamined Patent Publication No. 2000-292506

Patent Document 4: Japanese Unexamined Patent Publication No. 2002-270918

SUMMARY OF THE INVENTION

Problem to be Solved by the Invention

The present invention has been made in consideration of the above problem about an MI element serving as an MI sensor in which an amorphous wire (placed on a substrate) having a good magnetic impedance effect is incorporated, and has as its object to reduce in size and in thickness while maintaining an output characteristic almost equal to that of a conventional MI element, to obtain a degree of freedom in choice of substrate materials, and to obtain a degree of freedom in size of a substrate wafer.

Means for Solving the Problem

A magneto-impedance sensor element according to the present invention includes:

a substrate formed of a non-magnetic material;

a planar pattern formed of a plurality of first conductive films arranged on a flat surface of the substrate surface;

an amorphous wire arranged along an aligning direction of the planar pattern so as to traverse the plurality of first conductive films;

an insulator that covers an outer peripheral surface of the amorphous wire and fixes the amorphous wire on the planar pattern; and a cubic pattern that is formed over an outer surface of the insulator and the surface of the planar pattern and formed of a plurality of second conductive films arranged so as to traverse the amorphous wire, wherein the planar pattern and the cubic pattern are formed such that a laminated junction portion obtained by jointing an end portion of the first conductive film and an end portion of the second conductive film to each other in a laminated state is formed on each of both sides of the amorphous wire on a flat surface of the substrate surface to form a detecting coil obtained by integrating the planar pattern and the cubic pattern around the insulator, and the insulator has a shape in which a width in a direction parallel to the planar pattern increases toward the planar pattern on a section perpendicular to an axis line of the amorphous wire.

Effect of the Invention

In the present invention, since the amorphous wire is fixed on the substrate surface with the insulator, an extending groove (see FIG. 14) needs not be formed on a substrate unlike in a conventional technique. In this manner, a drawback such as breakage of a substrate in formation of the extending groove can be prevented. Since the substrate can secure sufficient strength, the substrate can be reduced in thickness, and, consequently, an entire sensor can be reduced in size.

The problem of microfabrication processability is solved to increase the number of selective substrate materials. Furthermore, since the number of selective materials, thicknesses, and shapes of an insulator that isolates the amorphous wire and the detecting coil from each other increase, the detecting coil is reduced in diameter to make it possible to improve the sensitivity.

The insulator has a shape in which a width in a direction parallel to the planar pattern increases toward the planar pattern on a section perpendicular to an axis line of the amorphous wire. In this manner, the cubic pattern can be formed without short-circuiting or disconnecting the adjacent second conductive films of the cubic pattern serving as a conductive layer. In addition, in comparison with a groove type structure in which a coil is formed along a groove wall surface, a detecting coil can be formed in proximity to the wire, and an output from the same wire can be increased.

The reason why the cubic pattern can be formed without short-circuiting the second conductive films to each other by specifying the shape of the insulator as described above will be described later.

Methods for manufacturing a planar pattern formed of a plurality of first conductive films and a cubic pattern formed of a plurality of second conductive films will be described below. The methods for manufacturing the patterns are generally performed by methods of two types.

In the first method, a Cu layer is made on an insulator surface on which a conductive pattern is desired to be placed, a resist is placed on the resultant structure, and patterning including exposing and developing steps is performed to form a plurality of conductive films arranged in a predetermined state. The Cu layer is removed by etching. Thereafter, the resist is removed to form patterns.

In the second method, a thin lower Ti/Cu seed layer is made on an insulator surface on which a conductive pattern is desired to be placed, a resist is placed on the resultant structure, and patterning including exposing and developing steps to form a plurality of a conductive films arranged in a predetermined state is performed. A copper plating process is performed, and the resist is removed. Thereafter, the lower Ti/Cu seed layer is removed by selective etching to form patterns.

Problems are posed when the cubic pattern is formed.

For example, a description will be given in the first method. A problem is posed when the insulator does not have, unlike the one described above, on a section perpendicular to an axis line of the amorphous wire, a shape in which the width in the direction parallel to the planar pattern increases toward the planar pattern, but a shape in which, as shown in FIG. 15, a width in a direction parallel to a planar pattern of an insulator 97 decreases toward the planar pattern (a portion having decreased width will be called a recessed portion 90 hereinafter).

In this case, when a Cu layer 96 is made on the insulator 97, the Cu layer 96 is formed to have the same shape as that of the insulator 97. A positive type resist is placed on the Cu layer 96 and subjected to the above-described patterning. In this manner, a portion that is not exposed in the patterning is masked with the remaining resist, and will be a cubic pattern serving as a plurality of second conductive films arranged in a predetermined state in the future. On the other hand, a portion that is exposed in the patterning will be an non-patterned portion that dose not have a conductive film by removing resist, baring the Cu layer 96 to be removed by etching in the next step.

However, in the portion exposed in patterning, the recessed portion 90 that should be bared by the etching serves as an unexposed portion and is not dissolved in the developing step. For this reason, an unexposed portion resist 98 consequently remains.

Thus, in the etching, the Cu layer 96 under the remaining resist portion 98 remains without being etched. For this reason, the remaining Cu layer 96 short-circuits the plurality of adjacent second conductive films, and a detecting coil cannot be formed.

Also in the second method, as shown in FIG. 16, a Ti/Cu seed layer 96a is placed on the insulating layer 97 having a recessed portion, and a resist is placed on the upper portion of the resultant structure. Patterning including exposing and developing steps to form a plurality of conductive films arranged in a predetermined state is performed.

In this manner, the portion that is not exposed in the patterning is masked with the remaining resist. In the future, the resist is not plated in a plating step of Cu or the like. Subsequently, the non-patterned portion is formed by the resist removing step and the Ti/Cu seed layer removing etching step.

On the other hand, the portion exposed in the patterning will become a cubic pattern, which is arranged in a predetermined state and serves as a plurality of second conductive films, after a resist is removed by developing and then Cu or the like is plated on a Ti/Cu seed layer by a plating step.

However, in the portion exposed in the patterning, since the recessed portion 90 that should be bared in the developing step serves as an unexposed portion and is not dissolved in the developing step, so that the unexposed portion resist 98 remains. For this reason, when the Cu layer 96 is plated, the upper portion of the remaining resist portion 98 is not plated. As a result, the plurality of second conductive films are disconnected at a position corresponding to the remaining resist portion 98, and a detecting coil cannot be formed.

In the above description, a positive type resist is used. However, in a negative type resist, a resin exposed portion has opposite solubility in a developing step. For this reason, in the first method, the second conductive films are disconnected. In the second method, the Cu layer 96 is formed on the non-patterned portion to cause a short circuit.

In contrast to this, in the present invention, the insulator has a shape in which, on a section perpendicular to an axis line of the amorphous wire, a width in a direction parallel to the planar pattern increases toward the planar pattern. For this reason, the recessed portion is not present, and the unexposed portion resist is not present. Therefore, the Cu layer 96 is not formed on the non-patterned portion, the second conductive films are not disconnected, and a detecting coil can be formed.

Furthermore, in the structure according to the present invention, even in an MI element in which a bulk amorphous wire is incorporated, as in a thin film magnetic core of a multi-layered thin film magneto-impedance sensor element constituted only by thin films such as a sputtering film or a plating film, the substrate can be reduced in thickness. The thickness of the substrate can be reduced to a thickness of a film that can sequentially form an insulator and a detecting coil by using a bulk amorphous wire as a core on a flat surface of the substrate. For this reason, the substrate can further be reduced in thickness.

BEST MODE FOR CARRYING OUT THE INVENTION

Figure 1:
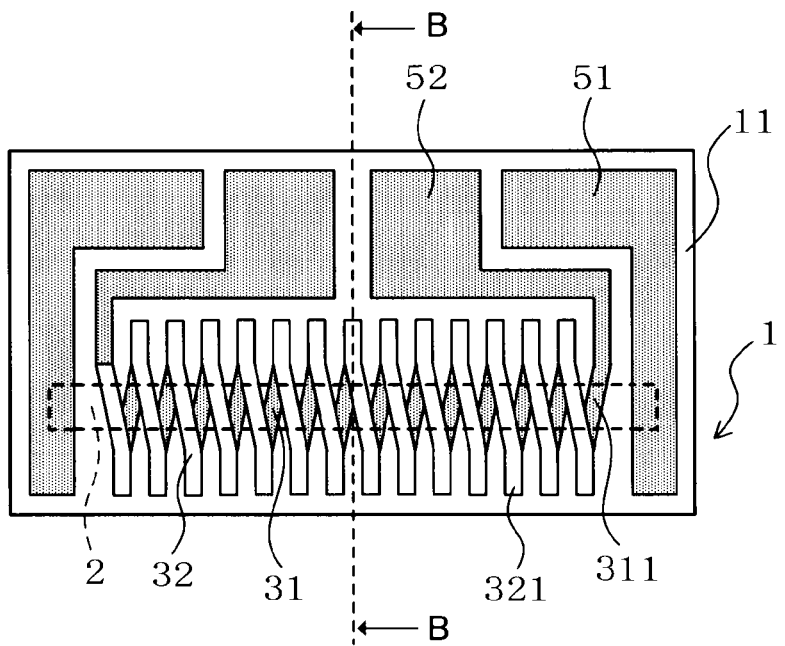
FIG. 1 is a conceptual diagram showing a front side of a magneto-impedance sensor element according to the present invention.

In the present invention, the amorphous wire preferably has a circular section perpendicular to an axis line of the amorphous wire.

The reason why the amorphous wire preferably has the circular section is that when a wire section is polygonal, an unnecessary magnetic domain is formed on a rectangular wire surface layer, resulting in deterioration of MI characteristics. Therefore, the circular shape in the present invention means that the shape basically has no angular portion. For this reason, a degree of fluctuation range of wire surface processing does not pose a problem, and an elliptic shape or an outer shape in which a circular outer periphery welters may be used instead of a true circle. Even in such a shape, sufficient MI characteristics can be obtained. In manufacturing, a circular shape is easily manufactured, and a polygonal shape is not easily manufactured.

In the present invention, the insulator is preferably shaped such that, when a maximum value of a width in a direction parallel to the planar pattern on a section perpendicular to an axis line of the amorphous wire and a diameter of the amorphous wire are indicated by L and d, respectively, L/d falls within a range of 1.3 to 5.

When L/d is less than 1.3, the insulator is not shaped to have a width that increases toward the planar pattern in a direction parallel to the planar pattern on the section perpendicular to an axis line of the amorphous wire, and that is one of the characteristics of the present invention. As a result, adjacent second conductive films of a cubic pattern are short-circuited, or the second conductive films are disconnected. For this reason, a detecting coil is difficult to be configured. When L/d exceeds 5, a width of an insulator is excessively large. Therefore, a problem such that an element cannot be reduced in size is posed.

The L/d preferably falls within the range of 2 to 5.

When the L/d is 2 or more, the insulator is configured to have a shape in which a width in a direction parallel to the planar pattern increases toward the planar pattern on a section perpendicular to an axis of the amorphous wire. Therefore, the adjacent second conductive films of the cubic pattern can be reliably avoided from being short-circuited or being disconnected. Thus, a detecting coil can be formed.

The insulator has three portions including a planar insulating portion that covers a surface of the planar pattern, a wire fixing portion that is interposed between the planar insulating portion and the amorphous wire and fixes the amorphous wire to the substrate, and a cubic insulating portion that is interposed between the amorphous wire and the cubic pattern and insulates the amorphous wire and the cubic pattern from each other. At least the wire fixing portion is preferably formed by using a liquid resin before the resin is solidified.

In this manner, the insulation of the amorphous wire can be achieved by the planar insulating portion and the cubic insulating portion. The wire fixing portion is formed using the liquid resin, and therefore the liquid resin can be arranged between the amorphous wire and the substrate without causing large stress to act on the amorphous wire. In this state, the liquid resin is solidified to fix the amorphous wire. Accordingly, the magnetic characteristics of the amorphous wire can be prevented from being deteriorated.

The planar insulating portion preferably has a film-like shape that is formed independently of the wire fixing portion before the wire fixing portion is formed.

In this manner, the planar insulating portion is formed in advance, and the amorphous wire can be placed on the planar insulating portion. For this reason, insulation property between the planar pattern and the amorphous wire can be improved.

The planar insulating portion is preferably formed integrally and simultaneously with the wire fixing portion.

In this case, the planar insulating portion and the wire fixing portion are integrated with each other to form one part that does not have a boundary therebetween. In comparison with a case in which the planar insulating portion is independently formed, manufacturing steps can be simplified.

The cubic insulating portion preferably has a film-like shape formed independently of the wire fixing portion.

In this manner, since the cubic insulating portion is independently formed after the wire fixing portion is formed, the insulation property between the amorphous wire and the cubic pattern can be more improved.

In this case, the wire fixing portion and the planar insulating portion may be integrally formed or independently formed.

The cubic insulating portion is preferably formed simultaneously and integrally with the wire fixing portion.

In this case, the cubic insulating portion and the wire fixing portion are integrated with each other to form one portion that does not have a boundary therebetween. In comparison with a case in which the cubic insulating portion is independently formed, the steps of manufacturing a magneto-impedance sensor element can be simplified.

In this case, the wire fixing portion and the planar insulating portion may be integrally formed or independently formed.

When the planar insulating portion, the wire fixing portion, and the cubic insulating portion are integrally formed to form one part, the manufacturing steps can be maximally simplified.

Preferably, the outer peripheral surface of the amorphous wire is covered with a glass coating, and the glass coating configures at least a part of the cubic insulating portion.

In this manner, the insulation property of the amorphous wire can be improved by the glass coating. For example, in manufacturing, the amorphous wire with a glass coating is arranged on the substrate, and the liquid resin merely drops, so that the amorphous wire can also be easily fixed to the substrate surface while securing good insulation property.

According to the structure, the MI element can further be reduced in size, and the cubic pattern of the detecting coil is formed on the outer periphery of the insulating film (glass coating) formed so as to cover the bulk amorphous wire and the outer periphery surface thereof to reduce a diameter of a substantially circle of the detecting coil, and the sensitivity can be improved. Also in this case, a section perpendicular to an axis line of the wire is preferably circular. In particular, the shape is preferably true circular or elliptical. This is because a wire having a shape other than the above shapes is difficult to be manufactured.

More preferably, the outer peripheral surface of the amorphous wire is covered with a glass coating, and the glass coating configures at least a part of the cubic insulating portion, and only the glass coating configures the planar insulating portion. In this manner, the insulator can be further reduced in thickness, and a diameter of a substantially circle of the detecting coil is further reduced to improve sensitivity.

The present invention provides a method for manufacturing a magneto-impedance sensor element including the steps of:

forming the planar pattern on a flat surface of the substrate surface;

arranging the amorphous wire on the planar pattern and forming the insulator; and forming the cubic pattern, wherein in the step of forming the insulator, a wire fixing portion that fixes at least the amorphous wire to the substrate is formed such that, after the amorphous wire is caused to adhere to the planar pattern by using a liquid resin, the liquid resin is solidified.

Figure 14:
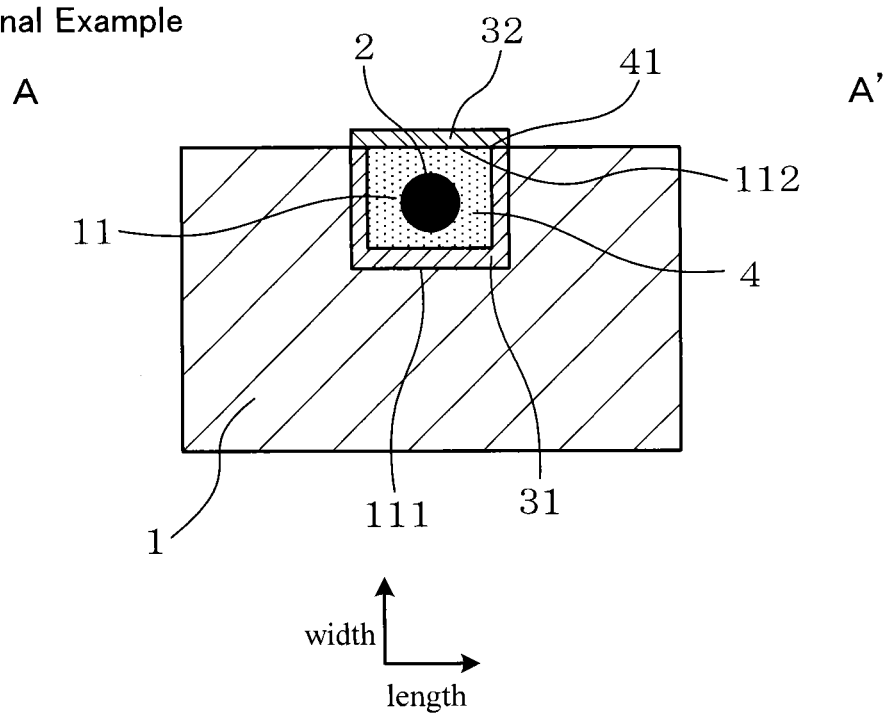
FIG. 14 is a conceptual diagram showing a section of a conventional technique (groove type MI element) of Patent Document 2.
Figure 15:
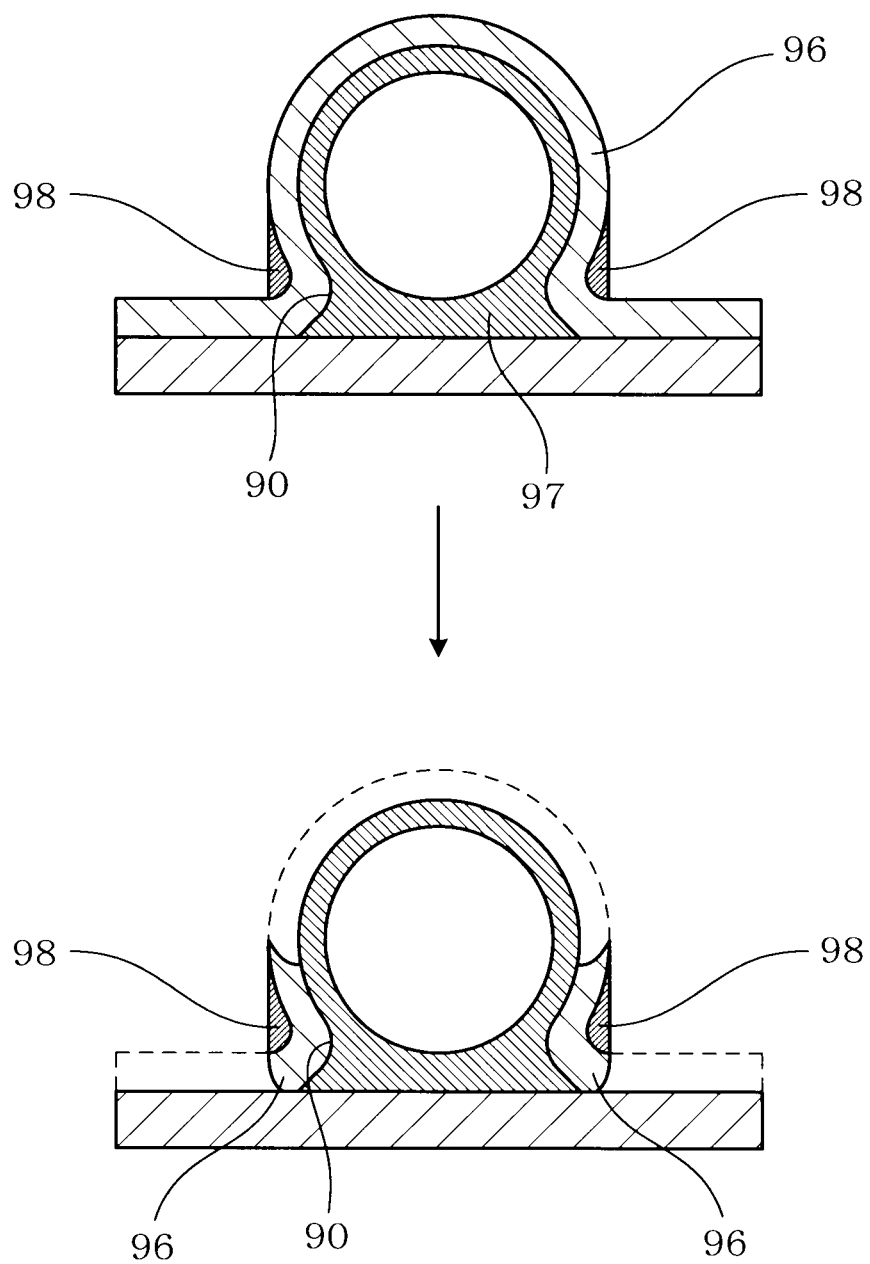
FIG. 15 is a diagram to explain a problem in an insulating layer shape of an MI element.
Figure 16:
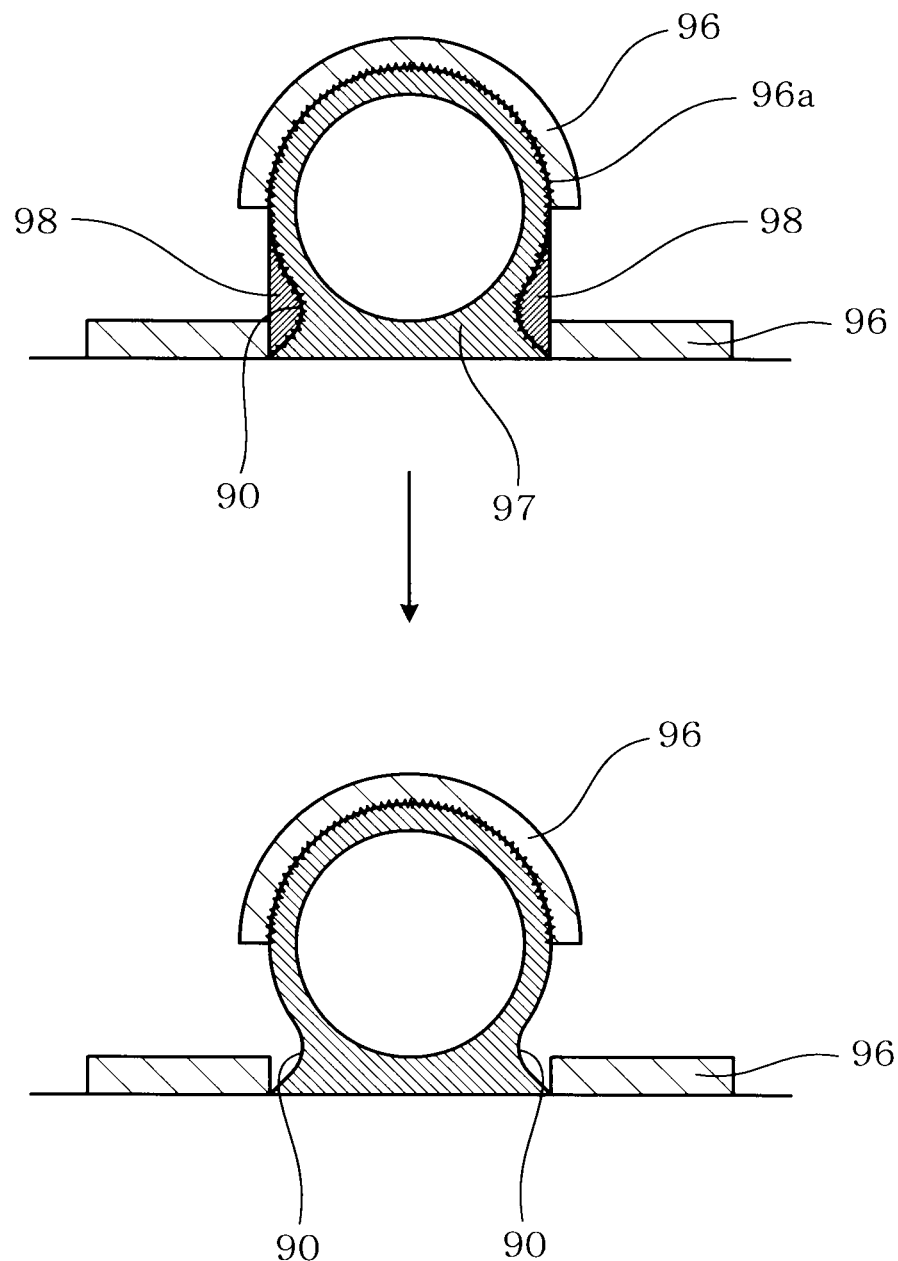
FIG. 16 is a diagram to explain a problem in an insulating layer shape of an MI element.

According to the method for manufacturing a magneto-impedance sensor element, since the step of forming the insulator is performed to make it possible to fix the amorphous wire having a circular section to the substrate surface, an extending groove (see FIG. 14) needs not be formed in the substrate. For this reason, a drawback such as breakage of the substrate in formation of an extending groove can be prevented. Since the strength of the substrate can be sufficiently secured, the substrate can be reduced in thickness, and, consequently, the entire sensor can be reduced in size.

Furthermore, in the step of forming insulator, since the wire fixing portion is formed by using a liquid resin, large stress needs not be caused to act on the amorphous wire. In this manner, the magnetic characteristics of the amorphous wire can be prevented from being deteriorated.

The step of forming the insulator is performed such that an amorphous wire is placed on a planar pattern and a liquid resin is caused to drop. In this manner, the amorphous wire is settled on the planar pattern. Thereafter, when the resin is solidified, the amorphous wire is fixed on the planar pattern.

Since the amorphous wire having a minute diameter is fixed by using the liquid resin, the minute-diameter amorphous wire can be incorporated in the MI element without applying large stress.

In the step of forming the insulator, depending on a structure of a desired insulator, a plurality of steps can be added. For example, the planar insulating portion described above is to be formed independently of the wire fixing portion, the step of forming a planar insulating portion is added before the amorphous wire is arranged on the substrate. For example, when the cubic insulating portion described above is formed independently of the wire fixing portion, the step of forming a cubic insulating portion is added after the amorphous wire is fixed by the wire fixing portion.

As described above, the MI element according to the present invention is a planar type structure in which an insulator and a detecting coil are sequentially formed on a substrate by microfabrication using a bulk amorphous wire as a core. The configurations or the like of the respective portions will be described below in detail.

Since the substrate does not require an extending groove having a recessed shape, a thin substrate, for example, a substrate having a thickness of 0.010 mm to 0.45 mm can be used. When the thickness is less than 0.010 mm, an amorphous wire, an insulator, and a detecting coil cannot be easily formed on the substrate in a planar structure. When the thickness exceeds 0.45 mm, the MI element cannot be reduced in size and thickness. When a silicon wafer is used, a thickness of the substrate is preferably 0.015 mm to 0.30 mm in terms of the size of the silicon wafer and a reduction in thickness.

A cutting process to form an extending groove on the substrate is not required, and a substrate material is not limited. For this reason, an alumina ceramic, which is insulator; a silicon wafer, which is semiconductor; a metal, which is conductor; and the like can be used. Furthermore, when a silicon wafer is used for a substrate, the diameter of the silicon wafer can be 6 inches to 12 inches.

In the MI element according to the present invention, in order to achieve reduction in size and thickness, the thickness of the substrate needs to be reduced, and the size of the bulk amorphous wire arranged on the substrate needs to be reduced.

More specifically, the diameter of the bulk amorphous wire requires to be reduced (although the diameter means a diameter of a substantial circle, to be referred to as a diameter hereinafter). An amorphous wire having a diameter in a range of 8 to 30 μm can be easily applied as the amorphous wires manufactured at present, and the length is preferably 1 mm or less. When the diameter of the amorphous wire is increased, the MI element increases in height, and reduction in thickness cannot be achieved.

Since a hysteresis of the MI sensor is preferably small, the diameter of the amorphous wire is preferably 20 μm or less.

The bulk amorphous wire used in the planar type MI element according to the present invention can exert an MI effect. The amorphous wire is preferably formed of a soft magnetic alloy having a zero magnetostriction, wherein the main phase of the alloy is amorphous. For example, Science and Engineering of Magnetic Sensors, CORONA PUBLISHING CO., LTD, p. 13 describes that, when Fe/Co is about 0.07 in $(CoFe)_{80}(SiB)_{20}$, an absolute value of the magnetostriction is less than $10^{-6}$. It is described that the magnetostriction at this level is a zero magnetostriction. It is assumed that the zero magnetostriction in the present invention is at this level.

A composition of a magneto-sensitive wire is preferably an alloy having a zero magnetostriction of a Co—Fe—Si—B-based material. As another composition, a soft magnetic alloy configured by a known alloy-based material such as a Co—Mn—Si—B-based material or an Fe—Si-based material and has an amorphous phase as a main phase may be used.

The MI effect cannot be sufficiently exerted when external stress acts on the amorphous wire, and magnetic characteristics such as linearity of an output voltage detected with respect to an intensity of a magnetic field and sensitivity are deteriorated.

Therefore, an insulator including an amorphous wire requires a function of insulating the amorphous wire in which an exciting current flows from a detecting coil that detects an intensity of a magnetic field and a function of fixing the amorphous wire having a minute diameter and a short length on a substrate.

In this case, the insulator that electrically insulates a planar pattern configuring a lower part of the detecting coil from the amorphous wire and an insulator that covers the amorphous wire requires an insulating function. As an example of the insulator, an inorganic insulating material such as aluminum oxide or silicon oxide or an organic insulating material such as an epoxy resin is given.

The insulator may be formed of an organic or inorganic insulating materials as long as the insulator has both the functions.

As the organic insulating material having both the functions, a liquid epoxy resin is preferably used. For example, when the planar insulating portion is formed independently of the wire fixing portion, on the substrate, a planar insulating portion configured by an insulator (may be an $SiO_2$ film obtained by a CVD method or an epoxy resin film obtained by a coating method) is formed on a planar pattern configured by a plurality of conductive films constituting a lower part of the detecting coil. Next, the straight amorphous wire is placed on an upper surface of the planar insulating portion without causing stress to act on the amorphous wire, and a liquid epoxy resin having wettability improved by solvent dilution is dropped between the planar insulating portion and the amorphous wire. At this time, an amorphous wire surface including a lower portion of the amorphous wire and the planar insulating portion is wetted by the epoxy resin. Surface tension acts on between the planar insulating portion and the amorphous wire to settle the amorphous wire on the upper surface of the insulator while keeping the amorphous wire straight.

The amorphous wire fastened with the epoxy resin is left for a while or baked to solidify the epoxy resin, thereby fixing the amorphous wire onto the substrate.

In this manner, the amorphous wire having a diameter of 8 to 30 μm can be arranged on the planar pattern of the substrate without causing large stress to act on the amorphous wire. For this reason, the magnetic characteristics (MI effect) of the amorphous wire need not be seriously influenced.

Furthermore, when the liquid resin is applied to the amorphous wire fixed on the planar pattern, a film-like insulator is formed along the shape of an outer peripheral surface of the amorphous wire due to surface tension. For this reason, the amorphous wire is included in the thin-film insulator having a shape along the sectional shape of the amorphous wire.

When an $SiO_2$ film obtained by a CVD method is formed on the outer peripheral surface of the amorphous wire fixed on the planar pattern, a film-like insulating layer is formed to obtain a shape along the sectional shape of the amorphous wire.

In this manner, the detecting coil formed on the outer peripheral surface of the insulator has a shape along the sectional shape of the amorphous wire in comparison with a detecting coil of a conventional groove type, and the amorphous wire and the detecting coil are proximate to each other through the insulator. For this reason, detection sensitivity of an external magnetic field can be improved.

A part or all of the outer periphery of the amorphous wire can be insulated with a glass coating. In this manner, the insulator having the shape along the sectional shape of the amorphous wire can be more reduced in thickness, and detection sensitivity of an external magnetic field can be more improved.

Furthermore, even though an amorphous wire having an insulative glass coating is directly placed on a planar pattern, the insulation property between both the amorphous wire and the planar pattern is secured by the glass. For this reason, as a function of a material to settle and fix the amorphous wire on the planar pattern, only the fixing function is necessary. More specifically, since the material is not limited to the above insulative material, it increases a degree of freedom of choice of materials to fix the amorphous wire on the planar pattern of the substrate without large external stress that gives influence on the MI effect of the amorphous wire.

EMBODIMENTS

Embodiment 1

A first embodiment of a planar type MI element according to the present invention will be described below with reference to FIGS. 1 and 2. FIG. 1 is a conceptual diagram showing a front side of a planar type MI element 1, and FIG. 2 is a view on arrow along a B-B line in FIG. 1.

Figure 2:
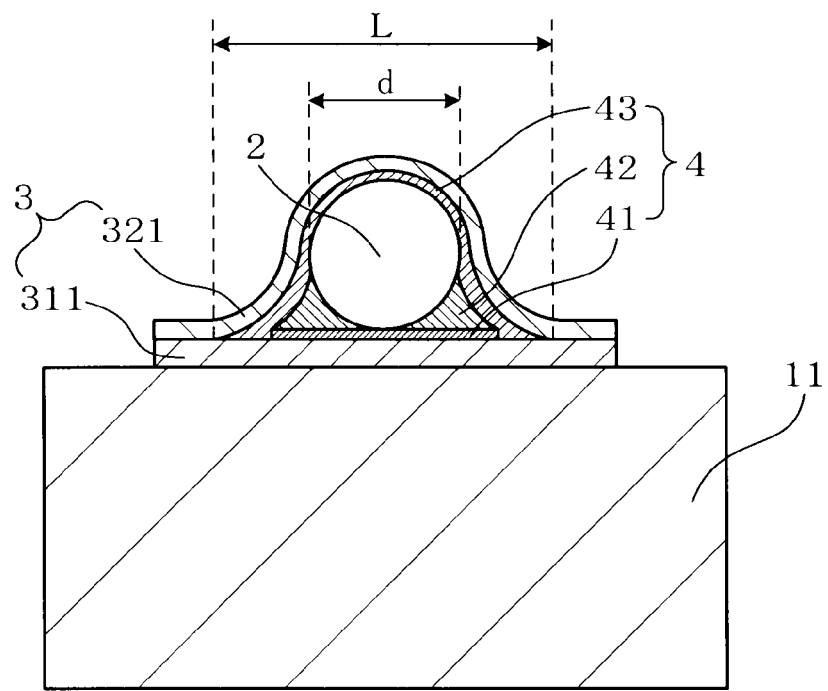
FIG. 2 is a view on arrow along a B-B line in FIG. 1 in Embodiments 1, 2, and 7.

As shown in FIGS. 1 and 2, the magneto-impedance sensor element 1 according to the present invention includes a substrate 11 formed of a nonmagnetic material. The magneto-impedance sensor element 1 includes a planar pattern 31 configured by a plurality of first conductive films 311 arranged on a flat surface of a substrate surface. The magneto-impedance sensor element 1 includes an amorphous wire 2 having a circular section that is arranged along an aligning direction of the planar pattern 31 so as to traverse the plurality of first conductive films 311. Furthermore, the magneto-impedance sensor element 1 includes an insulator 4 that covers an outer peripheral surface of the amorphous wire 2 and fixes the amorphous wire 2 on the planar pattern 31.

The magneto-impedance sensor element 1 includes a cubic pattern 32 formed of a plurality of second conductive films 321 formed over an outer surface of the insulator 4 and a surface of the planar pattern 31 and arranged so as to traverse the amorphous wire 2.

Laminated junction portions obtained by jointing end portions of the first conductive films 311 and end portions of the second conductive films 321 to each other in a laminated state are formed on both sides of the amorphous wire 2 on a flat surface of the substrate surface to form a detecting coil 3, which is obtained by integrating the planar pattern 31 and the cubic pattern 32 around the insulator 4.

The insulator 4 has a shape in which a width in a direction parallel to the planar pattern increases toward the planar pattern on a section perpendicular to an axis line of the amorphous wire 2.

As shown in FIG. 2, the insulator 4 is configured to have a shape such that, when a maximum value of a width in a direction parallel to the planar pattern 31 on the section perpendicular to the axis line of the amorphous wire 2 and the diameter of the amorphous wire 2 are given by L and d, respectively, L/d falls within a range of 1.3 to 5.

As shown in FIG. 2, the insulator 4 has three portions including a planar insulating portion 41 that covers a surface of the planar pattern 31, a wire fixing portion 42 that is interposed between the planar insulating portion 41 and the amorphous wire 2 and fixes the amorphous wire 2 to the substrate 11, and a cubic insulating portion 43 that is interposed between the amorphous wire 2 and the cubic pattern 32 and insulates the amorphous wire 2 and the cubic pattern 32 from each other. At least the wire fixing portion 42 is formed by using a liquid resin before the resin is solidified.

The planar insulating portion 41 has a film-like shape formed independently of the wire fixing portion 42 before the wire fixing portion 42 is formed.

The cubic insulating portion 43 has a film-like shape formed independently of the wire fixing portion 42.

As shown in FIGS. 1 and 2, the substrate 11 is formed of a nonmagnetic insulating alumina substrate to have a width of 0.3 mm, a thickness of 0.3 mm, and a length of 1.0 mm.

The amorphous wire 2 is zero-magnetoresistive and has an alloy composition of $(Co_{94}Fe_6)_{72.5}Si_{12.5}B_{15})$, an amorphous phase as a main phase, and a diameter of 30 μm and a length of 0.9 mm. The amorphous wire 2 was manufactured by an in-rotating liquid spinning process. The amorphous wire 2 is arranged on an upper surface of the planar insulating portion 41 serving as an insulating layer formed on upper surfaces of the first conductive films 311, which will be described later, along an aligning direction of the planar pattern 31 so as to traverse the first conductive films 311. An amorphous wire other than a glass-coated wire that was used in the other embodiments or the like was manufactured by the same method as described above.

The detecting coil 3 is spirally formed of the planar pattern 31 and the cubic pattern 32.

In the planar pattern 31, 15 ribbon-like first conductive films 311 having conductivity and having a width of 15 μm and a thickness of 2 μm are arranged on a flat surface of the substrate 11.

On the other hand, the cubic pattern 32 is formed of 15 ribbon-like second conductive films 321 each having conductivity and having a width of 15 μm and a thickness of 2 μm and arranged in the same aligning direction as that of the first conductive films 311, and the pattern 32 is formed over the outer surface of the cubic insulating portion 43 formed so as to include the amorphous wire 2 and the surface of the planar pattern 31.

More specifically, laminated junction portions obtained by jointing end portions of the first conductive films 311 and end portions of the second conductive films 321 to each other in a laminated state are formed on both sides of the amorphous wire 2 on a flat surface of the substrate surface to form a spiral detecting coil 3, which has a winding number of 15 and obtained by integrating the planar pattern 31 and the cubic pattern 32 with each other.

In this case, the first conductive films 311 constituting the planar pattern 31 are made by the above-described two methods normally used. In the first method, a thin lower Ti/Cu seed layer having a thickness of 0.1 μm is made on the flat surface of the substrate 11, a resist is placed on the resultant structure, and patterning including exposing and developing steps is performed to form a plurality of conductive films arranged in a predetermined state. Next, after a copper plating process is performed to remove the resist, the lower Ti/Cu seed layer is removed by selective etching to form the first conductive films.

In the second method, a Cu layer is made on the flat surface of the substrate 11, a resist is placed on the resultant structure, and patterning including exposing and developing steps is performed to form a plurality of conductive films arranged in a predetermined state. Next, the Cu layer is removed by etching, and, thereafter, the resist is removed to form the first conductive films. The cubic pattern 32 is formed on the insulating layer in the same manner as described above.

The insulator 4 is formed of the planar insulating portion 41 formed on the upper surface of the planar pattern 31 to insulate the planar pattern 31 that is formed on the flat surface of the substrate 11 and the amorphous wire 2, the wire fixing portion 42 that fixes the amorphous wire 2 on the upper surface of the planar insulating portion, and the cubic insulating portion 43 that includes the amorphous wire 2 to insulate the amorphous wire 2 and the cubic pattern 32 arranged on the upper surface of the wire fixing portion 42.

More specifically, after the planar pattern 31 is formed on the flat surface of the substrate 11, the planar insulating portion 41 having a thickness of 2 μm is formed on the upper surface of the planar pattern 31 with a photosensitive epoxy resin.

The amorphous wire 2 is straightly arranged in a longitudinal direction on the upper surface of the planar insulating portion 41, and a liquid epoxy resin diluted with a solvent is dropped between the planar insulating portion 41 and the amorphous wire 2 to form the wire fixing portion 42. The amorphous wire 2 in the longitudinal direction along a gap between the surface of the amorphous wire 2 and the planar insulating portion 41 is wetted with the epoxy resin, and the amorphous wire 2 is settled on the upper surface of the planar insulating portion 41 by an action of surface tension. After the settlement, when the epoxy resin diluted with the solvent is baked at 100° C. for about 30 minutes, the amorphous wire 2 is fixed on the upper surface of the planar insulating portion 41 with the wire fixing portion 42.

After the amorphous wire 2 is fixed on the upper surface of the planar insulating portion, the cubic insulating portion 43 formed of an insulating layer having a thickness of about 2 μm is formed by a photosensitive epoxy resin so as to include the amorphous wire 2. Application of a liquid resin forms the cubic insulating portion 43 due to surface tension which is configured to have a film-like shape along an outer peripheral surface of the amorphous wire. The insulator is formed of an insulating layer that is proximate to a thin-film-like wire having a shape along a sectional shape of the amorphous wire in comparison with a shape of an insulating layer in a groove type structure.

Next, as described above, the second conductive film 321 is formed over the outer surface of the cubic insulating portion 43 and the surface of the planar pattern 31.

At this time, the cubic patterns 31 are formed many in portions along the sectional shape of the amorphous wire through the thin-film cubic insulating portion 43.

A total of four electrodes 5 including terminals 51 of the amorphous wire 2 and terminals 52 of the detecting coil 3 are burned on the flat surface of the substrate 11.

As the dimensions of the MI element configured as described above, a width of 0.3 mm and a length of 1.0 mm that are dimensions of the substrate 11 and a thickness of about 0.35 mm obtained by summing up a thickness of 0.3 mm of the substrate 11, a diameter of 30 μm of the amorphous wire 2, the thickness of 2 μm of the planar insulating portion 41, the thickness of 2 μm of the cubic insulating portion 43, the thickness of 2 μm of the planar pattern 31 and the thickness of 2 μm of the cubic pattern 32 are set. The winding number of the detecting coil is 15.

Figure 3:
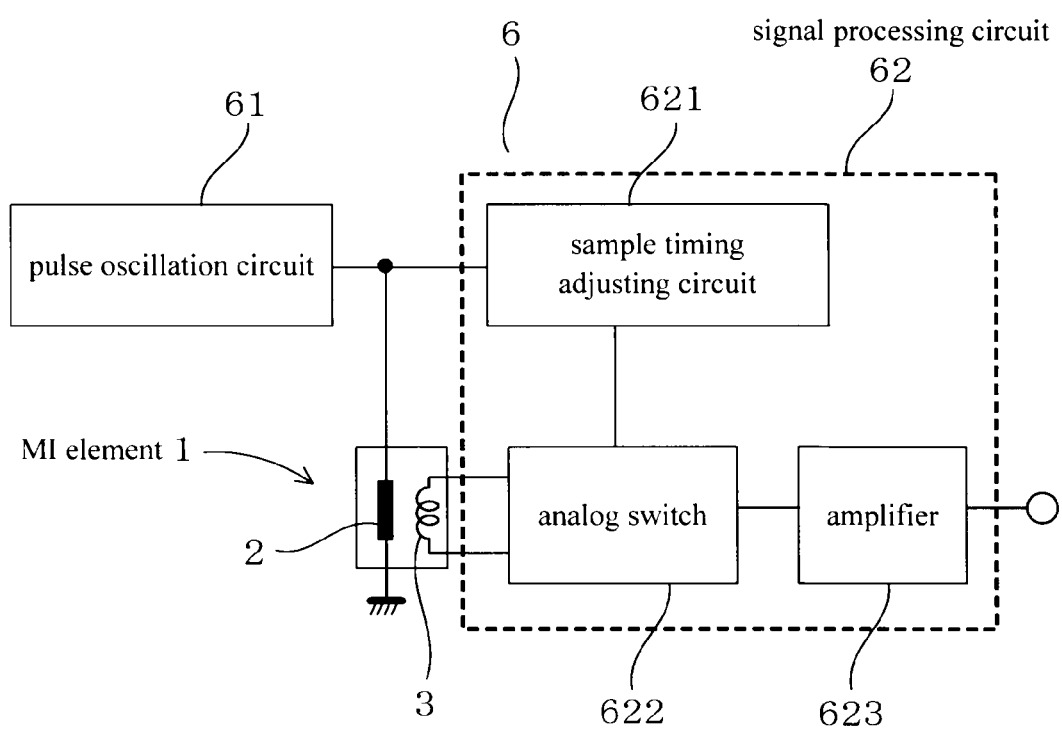
FIG. 3 is an explanatory diagram showing a method for evaluating an MI element in the embodiment.
Figure 4:
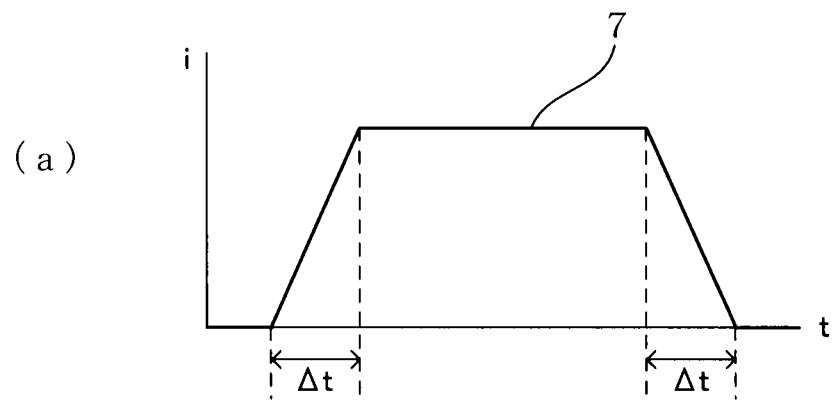
FIG. 4 is an explanatory diagram showing a method for evaluating the MI element in the embodiment.
Figure 4:
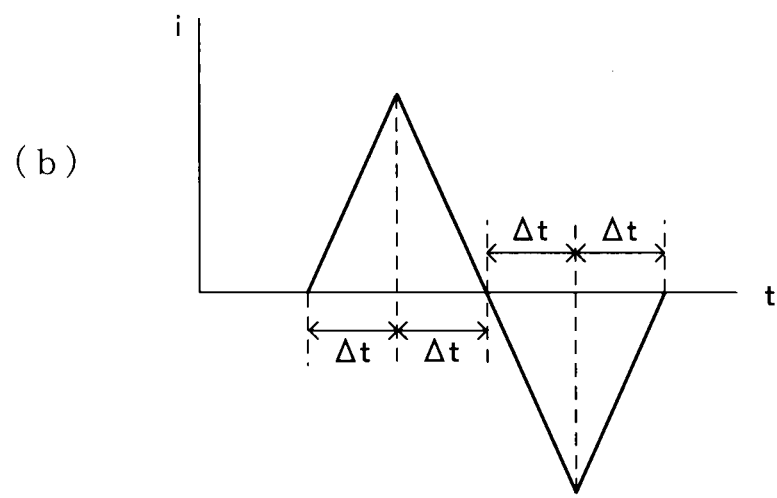

An electronic circuit of an MI sensor 6 using the magneto-impedance sensor element (MI element) according to the present invention will be described with reference to FIG. 3. The MI sensor 6 includes an MI element 1, a pulse oscillation circuit 61, and a signal processing circuit 62. The sensor operates as described below. When a pulse current having a high frequency equivalent to about 200 MHz and generated by the pulse oscillation circuit 61 is supplied to a magneto-sensitive wire 2 in the MI element 1, a voltage corresponding to an external magnetic field obtained by an action between an external magnetic field and a magnetic field in a wire circumferential direction by a pulse current is generated in the detecting coil 3. The frequency mentioned here is calculated by calculating a rise or fall time $\Delta t$ of a pulse in a pulse current waveform 7 as shown in FIG. 4($a$) and assuming the $\Delta t$ is equal to ¼ period of the wave as shown in FIG. 4($b$). After the pulse current rises by a sample timing adjusting circuit 621, an analog switch 622 is turned on and off in a predetermined timing for a short period of time. In this manner, the analog switch 622 samples and transmits a voltage corresponding to the external magnetic field generated in the detecting coil 3 to an amplifier 623. When the pulse current is cut off (falling state), the same operation as described above can be performed. This configuration is an example, and the same effect as described above can be obtained in an electronic circuit using a known MI sensor. In this specification, a measurement is made in the falling state.

In the example, a pulse signal having 170 mA equivalent to 200 MHz was input to the amorphous wire 2, and a voltage generated in the detecting coil 3 by an external magnetic field was measured.

As the dimension of the substrate in the groove type MI element, a width of 0.5 mm, a thickness (height) of 0.5 mm, and a length of 1.0 mm are given. The depth and the width of the groove on the substrate are 0.05 mm and 0.07 mm, respectively. As the amorphous wire, the same amorphous wire having a length of 0.9 mm and a diameter of 30 μm as that in Embodiment 1 is used, and the winding number of the detecting coil is 15 as in Embodiment 1.

The reason why a substrate according to this embodiment is allowed to be thinner than a substrate with a groove is as follows. Since an extending groove constituted by a recessed shape is not necessary, there is no possibility of breaking the substrate in an extending groove process, and the substrate needs not to be thickened to secure the strength when an MI element is assembled in the substrate groove, when the substrate is cut out of a wafer, or when the substrate is carried. Furthermore, in this embodiment, since a machinable ceramic having low strength need not be used, the thickness can be reduced from 0.5 mm (conventional technique) to 0.3 mm. In this embodiment, the alumina substrate that has a low price and sufficient strength and is excellent in chemical resistance was used. In place of the alumina, a relatively expensive silicon wafer or, when chemical resistance is not required, a glass epoxy resin can also be used. In general, a thickness of 0.1 to 0.2 mm can be easily achieved. However, a substrate having a thickness of 0.3 mm which can be easily available was used.

In this manner, as the dimensions of an entire element of a conventional technique, a width of 0.5 mm, a thickness (height) of 0.5 mm, and a length of 1.0 mm that are the same as the dimensions of the substrate are given. However, in the invention according to Embodiment 1, the dimensions of the entire element can be considerably reduced to a width of 0.3 mm, a thickness of 0.35 mm, and a length of 1.0 mm.

In this case, the diameter of the substantial circle of the detecting coil in Embodiment 1 is about 43 μm. The diameter of the substantial circle means a diameter of a circle having the same area as that of the section surrounded by a center portion of a detecting coil thickness. A proximity index n representing a proximity of the detecting coil to the amorphous wire and given by (diameter of substantial circle of detecting coil)/(amorphous wire diameter) was 1.4 in Embodiment 1.

On the other hand, in the conventional technique, the diameter of the substantial circle of the detecting coil is 67 μm. The proximity index n representing a proximity of the detecting coil to the amorphous wire and given by (diameter of substantial circle of detecting coil)/(amorphous wire diameter) was 2.2 in the conventional technique.

When both the conventional technique and Embodiment 1 are compared with each other, in the present invention, the coil could be proximately wound in comparison with the conventional technique. Furthermore, in this embodiment, L/d is 2.2 and falls within the range of 1.3 to 5.

In this description, the ability of the MI element was evaluated with a sensitivity calculated from a plus or minus output obtained when an alternate magnetic field of ±3 G was applied.

The sensitivity of the MI element in Embodiment 1 was 51 mV/Gauss. On the other hand, the sensitivity of the groove type MI element according to the conventional technique was 40 mV/Gauss.

According to the above result, in the embodiment of the present invention, even though the MI element were reduced in size and thickness, a sensitivity higher than that of the conventional MI element could be obtained.

An operational advantage of the magneto-impedance sensor element according to this embodiment will be described below.

As shown in FIG. 2, in this embodiment, since the amorphous wire 2 is fixed on the substrate 11 with the insulator 4, unlike in the conventional technique, an extending groove needs not to be formed in the substrate 11. In this manner, a drawback such as breakage of the substrate 11 in formation of an extending groove can be prevented. Since the substrate 11 can secure sufficient strength, in comparison with the conventional technique, the substrate 11 can be reduced in height by 30%, and, consequently, the entire sensor can be reduced in size.

The insulator 4 has a shape in which, on a section perpendicular to an axis line of the amorphous wire 2, a width in a direction parallel to the planar pattern 31 increases toward the planar pattern 31. In this manner, the insulator 4 can be formed without short-circuiting the adjacent second conductive films of the cubic pattern serving as a conductive layer or disconnecting the second conductive films. In comparison with a groove type structure in which a coil is formed along a groove wall surface, the detecting coil can be formed in proximity to the wire, and an output from the same wire can be increased.

In this embodiment, since L/d is 2.2, a cubic pattern can be formed, a small-size detecting coil can be formed, and the element can be reduced in size.

As shown in FIG. 2, the insulator 4 has the three portions including the planar insulating portion 41, the wire fixing portion 42, and the cubic insulating portion 43. At least the wire fixing portion 42 is formed by using a liquid resin before solidification.

In this manner, the insulation property of the amorphous wire 2 can be secured by the planar insulating portion 41 and the cubic insulating portion 43. Since the wire fixing portion 42 is formed of the liquid resin, large stress is not caused to act on the amorphous wire 2. For this reason, the magnetic characteristics of the amorphous wire 2 are not easily deteriorated.

As shown in FIG. 2, the planar insulating portion 41 has a film-like shape that is formed independently of the wire fixing portion 42 before the wire fixing portion 42 is formed.

In this manner, the planar insulating portion 41 is formed in advance, and the amorphous wire 2 can be placed on the planar insulating portion 41. For this reason, the insulation property between the planar pattern 31 and the amorphous wire 2 can be improved.

As shown in FIG. 2, the cubic insulating portion 43 has a film-like shape formed independently of the wire fixing portion 42.

In this manner, since the cubic insulating portion 43 is independently formed after the wire fixing portion 42 is formed, the insulation property between the amorphous wire 2 and the cubic pattern 32 can be improved.

Embodiment 2

In Embodiment 2, the same material as that of the amorphous wire in Embodiment 1 and the conventional technique is used, a wire diameter is reduced from 30 μm to 10 μm, and a wire length is shortened from 0.9 mm to 0.57 mm. Accordingly, the length of the substrate is shortened from 1.0 mm to 0.6 mm. The other conditions are the same as those in Embodiment 1.

As a result, a diameter of a substantial circle of a detecting coil in Embodiment 2 can be considerably reduced in size to about 19 μm in comparison with about 43 μm in Embodiment 1 and the entire substrate height can be more reduced. The proximity index n given by (diameter of substantial circle of detecting coil)/(amorphous wire diameter) was 1.9 in Embodiment 2. Although inferior to Embodiment 1, a proximate winding is achieved in Embodiment 2 in comparison with the conventional technique in which n=2.2.

Furthermore, L/d=2.8 can be obtained. The value falls within the range of 1.3 to 5.

A sensitivity of the MI element in Embodiment 2 is 49 mV/Gauss. This is an excellent characteristic that exceeds a sensitivity of 40 mV/Gauss of a conventional groove type MI element.

An advantage obtained by modifying Embodiment 1 into Embodiment 2 is that, while the element has a sensitivity exceeding that of the conventional technique, the element can be considerably reduced in size. That is, as to the element dimensions, an element height in Embodiment 2 is reduced to about 0.32 mm in comparison with about 0.35 mm in Embodiment 1, an element length in Embodiment 2 is shortened to 0.6 mm in comparison with 1 mm in Embodiment 1, a volume of the entire sensor is reduced by about 75% in comparison with that in the conventional technique, and about 45% in comparison with that in Embodiment 1.

According to the above result, in Embodiment 2, although a magneto-sensitive wire itself was reduced in size, i.e., in diameter and length, the MI element obtained an excellent sensitivity exceeding that of a conventional MI element and could be considerably reduced in size in comparison with the conventional technique and Embodiment 1.

In general, reduction in wire diameter will lead to reduction of a magneto-sensitive material in volume, and which may cause reduction of an output.

However, in this embodiment, although a wire length is reduced, a diamagnetic field in an axial direction of the wire decreases as a whole since a wire diameter is decreased. Furthermore, a high output is obtained due to proximate winding of the detecting coil. For this reason, a high-sensitivity that compensates for the reduction in volume of the magneto-sensitive material can be achieved.

The amorphous wire diameter is preferably 30 μm or less. A diameter of 25 μm or less is more preferable. A diameter of 15 μm or less is still more preferable.

Embodiment 3

Figure 5:
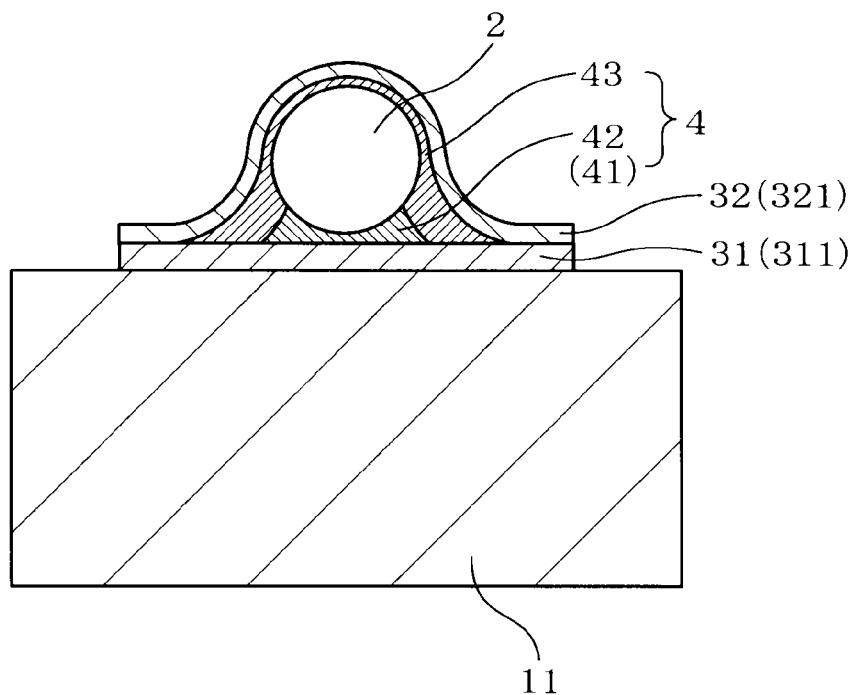
FIG. 5 is a view on arrow along a B-B line in FIG. 1 in Embodiment 3.

The embodiment is obtained by changing the configuration of the insulator 4. As shown in FIG. 5, in this embodiment, the planar insulating portion 41 is formed simultaneously and integrally with the wire fixing portion 42.

In this case, since the step of forming the planar insulating portion 41 can be omitted, the steps in manufacturing the magneto-impedance sensor element 1 are simplified.

Embodiment 4

Figure 6:
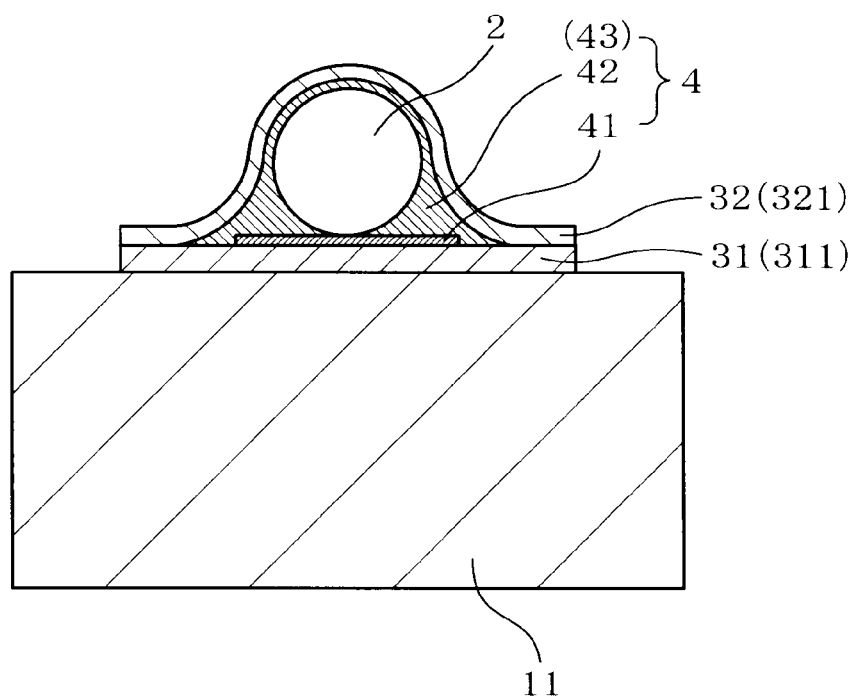
FIG. 6 is a view on arrow along a B-B line in FIG. 1 in Embodiment 4.

The embodiment is obtained by changing the configuration of the insulator 4. As shown in FIG. 6, in this embodiment, the cubic insulating portion 43 is formed simultaneously and integrally with the wire fixing portion 42.

In this manner, in comparison with a case in which the cubic insulating portion 43 is independently formed, the steps in manufacturing the magneto-impedance sensor element 1 are simplified.

Figure 7:
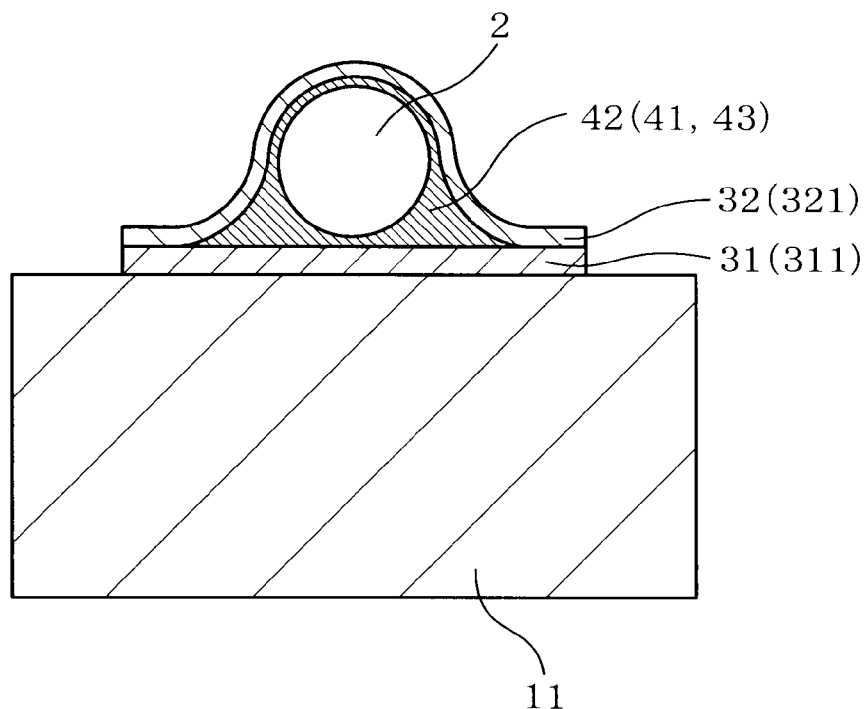
FIG. 7 is a view on arrow of a magneto-impedance sensor element in Embodiment 4, and shows an example in which an insulator is configured by using only a liquid resin.

As shown in FIG. 7, the planar insulating portion 41, the wire fixing portion 42, and the cubic insulating portion 43 may be integrally formed. In this case, the steps in manufacturing the insulator 4 can be maximally simplified.

Embodiment 5

A fifth embodiment of a planar type MI element according to the present invention will be described below with reference to FIG. 8.

Figure 8:
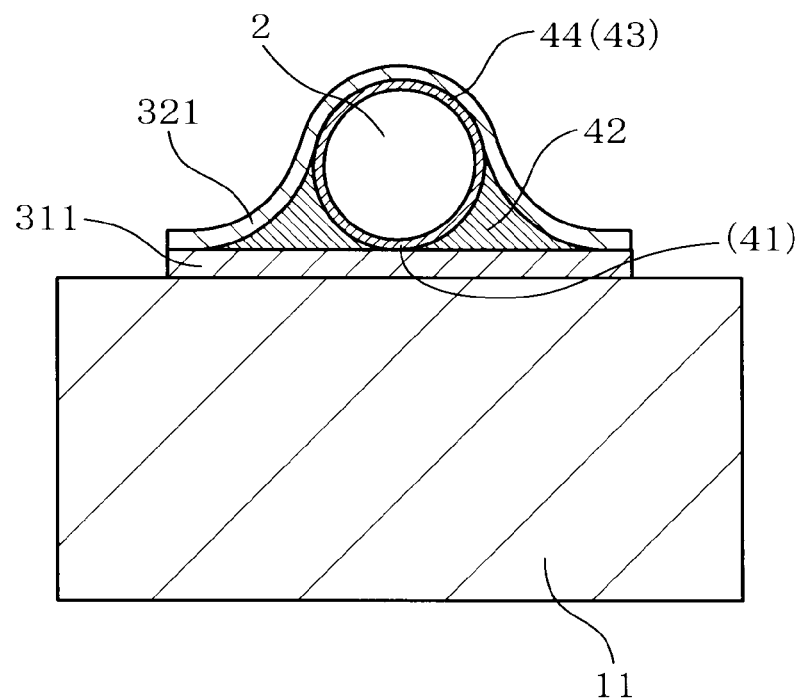
FIG. 8 is a view on arrow in FIG. 1 in Embodiment 5.

In this embodiment, as shown in FIG. 8, the amorphous wire 2 has an outer peripheral surface covered with a glass coating 44. The glass coating 44 configures at least a part of the cubic insulating portion 43, and only the glass coating 44 configures the planar insulating portion 41.

More specifically, the amorphous wire 2 has an outer peripheral surface covered with an $SiO_2$-based glass coating having insulation property and a thickness of 2 μm. In this case, the amorphous wire with glass coating is zero-magnetostrictive and has an alloy composition that is a Co71.2Fe4.8Si11.8B12.2 composition (at %) and amorphous phase as a main phase. The wire with glass coating was manufactured by an improved Taylor method. The glass coatings on side surfaces of the amorphous wire 2 near both the ends of the amorphous wire 2 are removed with ammonium hydrogen fluoride for connection to the electrodes.

The glass-coated amorphous wire 2 is directly placed on the upper surface of the planar pattern 31 and fixed with the wire fixing portion 42 made of an epoxy resin. Next, the second conductive films 321 are formed over the $SiO_2$-based glass coating 44 of the amorphous wire 2, the wire fixing portion 42 made of an epoxy resin, and the end portions of the first conductive films 311 to form the cubic pattern 32.

In the detecting coil 3 having the above configuration, in comparison with the first embodiment, a region of the detecting coil 3 having a shape along an outer peripheral shape of the amorphous wire 2 increases more to make it possible to increase the output and to improve the sensitivity.

In this case, a method for forming the second conductive films 321 is the same as that in the first embodiment.

In the above configuration, by the glass coating 44, the insulation property of the amorphous wire 2 can be more improved. In manufacturing, only by arranging the amorphous wire 2 with the glass coating 44 on the substrate 11 and dropping a liquid resin, the amorphous wire 2 can be easily fixed on the substrate surface while securing the insulation property.

In comparison with the first embodiment, the detecting coil 3 has a simple structure such that the insulation between the detecting coil 3 and the amorphous wire 2 is achieved by the glass coating 44, and fixation of the wire 2 on the planar pattern is achieved by the wire fixing portion. Furthermore, the glass coating is reduced in thickness to obtain a structure in which the detecting coil 3 can be more proximate to the wire 2. For this reason, an output from the magneto-impedance sensor element can be increased, and a sensitivity of the same can be improved.

Next, characteristics in this embodiment were evaluated. As an MI element according to the present embodiment, it is formed of the amorphous wire 2 having a diameter of 10 μm and a length of 0.93 mm coated with a glass coating having a thickness of 2 μm and the detecting coil 3 having a winding number of 15 on a flat surface of the MI element 1 having a width of 0.3 mm, a length of 1.0 mm, and a thickness of 0.3 mm. A diameter of a substantial circle (diameter of a circle having the same area as that of a section surrounded by a center portion of a detecting coil thickness) of the detecting coil is about 18 μm.

As a comparative example, a groove type MI element of a conventional structure was employed in which an extending groove having a depth of 50 μm and a width of 70 μm was formed by cutting a substrate having a width of 0.5 mm, a length of 1.0 mm, and a thickness of 0.5 mm. An insulator and a first detecting coil portion were buried in the extending groove with an amorphous wire having a diameter of 10 μm and a length of 0.93 mm as in Embodiment 5. A second detecting coil portion having a thickness of 2 μm was formed on an upper surface of the groove. This comparative MI element was configured such that a winding number of the detecting coil was 15, and a diameter of a substantial circle of the coil was about 67 μm.

Output voltages obtained when a pulse current corresponding to 200 MHz and having 200 mA was caused to flow in both the coils to change external magnetic fields were measured.

Figure 9:
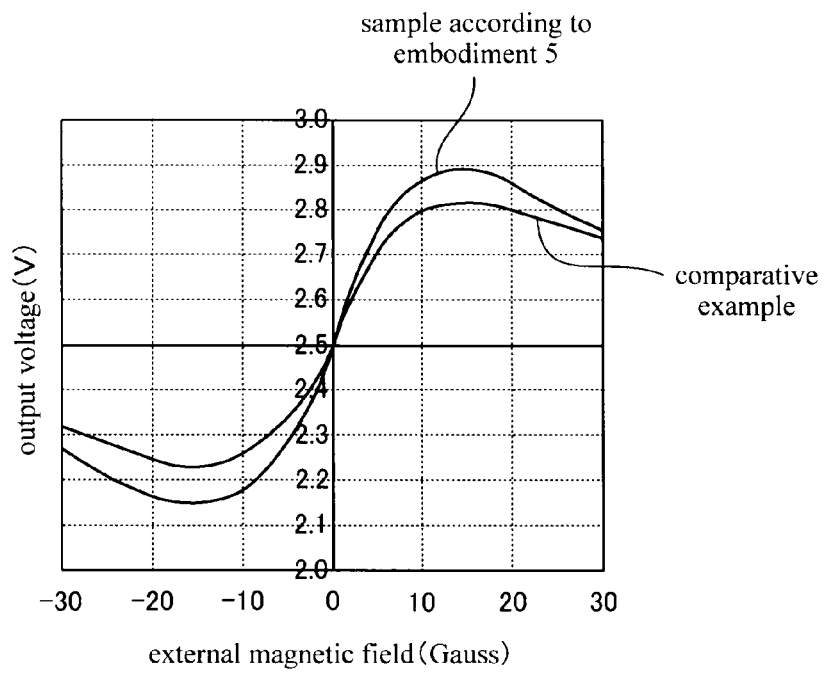
FIG. 9 is a graph showing characteristics in Embodiment 5 and a comparative example.

The results are shown in FIG. 9.

In comparing Embodiment 1 and the comparative example, an effect obtained by a difference between structures of detecting coils is evaluated using the same 30 μm-wire. In comparing Embodiment 5 and a comparative example mentioned here, an effect obtained by a difference between structures of detecting coil is evaluated using a wire having a smaller diameter of 10 μm.

In comparison with about 67 μm that is a diameter of a substantial circle of a detecting coil in the comparative example, the diameter of a substantial circle in Embodiment 5 is about 18 μm, i.e., about ¼, of the comparative example. In this case, the thickness of the entire element can be considerably reduced from 0.502 mm in the comparative example to 0.318 mm.

Furthermore, in Embodiment 5, even if a very thin wire having a diameter of 10 μm is used, a proximity index n, which is given by (diameter of substantial circle of detecting coil)/(amorphous wire diameter), is 1.8, achieving a proximal winding in comparison with the conventional technique in which n=2.2. In contrast to this, n is 6.7 in the comparative example, considerably decreasing proximity in winding in comparison with the conventional technique.

For this reason, it is understood that the structure of the present invention is suitable for a reduction in diameter of a wire. An abscissa in FIG. 9 indicates a magnitude of an external magnetic field, and an ordinate indicates an output voltage from a sensor.

A sensitivity of the MI element according to Embodiment 5 is 50 mV/Gauss, and a sensitivity of the comparative example based on the conventional technique is 41 mV/Gauss.

Therefore, when a magneto-sensitive wire is reduced in diameter, in comparison with Embodiment 1, a further reduction in size can be achieved. Furthermore, the sensor has a sensitivity that is almost equal to that in Embodiment 1 in which a wire diameter is 30 μm. In addition, in comparison with the comparative example, the sensitivity can be improved by 22%.

Embodiment 6

Figure 10:
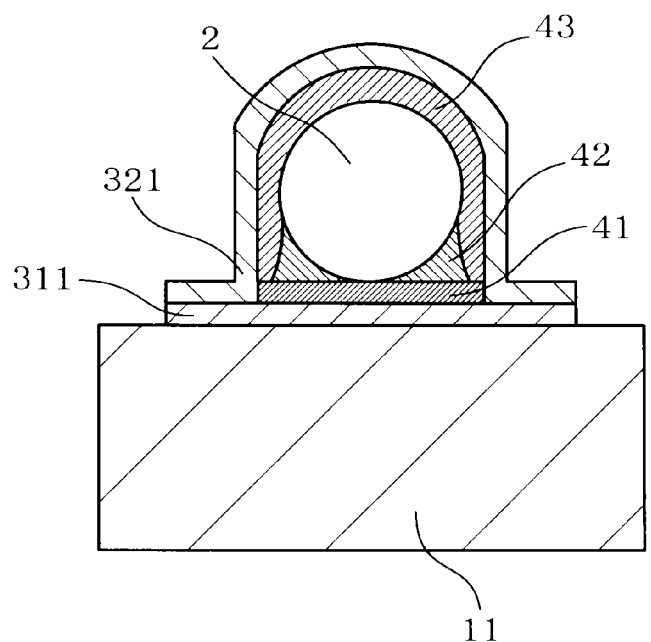
FIG. 10 is a view on arrow along a B-B line in FIG. 1 in Embodiment 6.

A sixth embodiment of a planar type MI element according to the present invention will be described below with reference to FIG. 10. FIG. 10 is a view on arrow along a B-B line of FIG. 1 in Embodiment 6.

In this embodiment, as shown in FIG. 10, a part of the second conductive films 321 configuring the cubic pattern 32 in the first embodiment is formed in a shape being along a shape of an outer peripheral surface of the amorphous wire 2 through the cubic insulating portion 43 formed in a film-like shape on the outer peripheral surface of the amorphous wire 2.

The second conductive film 321 is formed such that a portion extending from the arc-like portion toward the first conductive film is not formed in a curved shape that extends gradually away from the amorphous wire 2, but formed in a planar shape.

More specifically, the amorphous wire 2 is arranged on the upper surface of the planar insulating portion 41 having a thickness of 1.5 μm and formed by a CVD method using $SiO_2$, and the amorphous wire 2 is fixed with the wire fixing portion 42 formed of an epoxy resin diluted with a solvent. The cubic insulating portion 43 formed of an $SiO_2$ film is formed by a CVD method using $SiO_2$ over the outer peripheral surface of the amorphous wire 2 to the upper surface of the planar insulating portion 41. As a result, the cubic insulating portion 43 is formed as an arc-like 1.5-μm thin film along the outer peripheral surface of the amorphous wire 2 on the upper part of the outer peripheral surface of the amorphous wire 2 and planarly formed perpendicularly to the substrate on the side surface of the wire.

The second conductive films 321 are formed over the cubic insulating portion 43 formed along the shape of the outer peripheral surface of the amorphous wire 2 to the end portions of the first conductive films 311 to configure the cubic pattern 32. The detecting coil 3 is formed of the cubic pattern 32 formed on the amorphous wire 2 and the planar pattern 31. As a result, the detecting coil 3 forms an arc-like shape along with the amorphous wire 2 from a side surface to an upper side, and a diameter of a substantial circle of the detecting coil decreases to make it possible to cause the detecting coil 3 and the amorphous wire 2 to be very proximate to each other. At this time, L/D is 1.3. The value represents a critical proximity state.

The planar pattern 31 and the cubic pattern 32 mentioned here are formed by the same method as described above.

A method for manufacturing a detecting coil is not limited to the method described in the description, and another known method can be used.

As the dimensions of the MI element configured as described above, a width of 0.3 mm and a length of 0.6 mm that are the dimensions of the substrate 11 and a thickness of about 0.32 mm obtained by summing up a thickness of 0.3 mm of the substrate 11, a diameter of 10 μm of the amorphous wire 2, the thickness of 1.5 μm of the planar insulating portion 41, the thickness of 1.5 μm of the cubic insulating portion 43, the thickness of 2 μm of the planar pattern 31 and the thickness of 2 μm of the cubic pattern 32 are set.

The characteristics of the ultra-compact MI element according to the present invention were evaluated. A pulse signal corresponding to 200 MHz and having 170 mA was input to the amorphous wire 2, and a voltage generated in the detecting coil 3 by an external magnetic field was measured.

In Embodiment 6, a material, a thickness, and a shape of the insulating portion of Embodiment 2 obtained by modifying Embodiment 1 are changed, the same elements and factors and the same conditions as those in Embodiment 2 are used, and a detecting coil has a proximal structure. A diameter of a substantial circle in the Embodiment 6 is 16 μm that is smaller than 19 μm in Embodiment 2. The proximity index n of the detecting coil is 1.6 in Embodiment 6, achieving a proximal winding in comparison with Embodiment 2 in which n=1.9.

As a result, a sensitivity of the MI element according to this embodiment is 53 mV/Gauss. The sensor characteristic is improved in comparison with the sensitivity of 49 mV/Gauss in Embodiment 2.

Embodiment 7

A seventh embodiment of a planar type MI element according to the present invention will be described below with reference to FIGS. 1 and 2.

As dimensions of the substrate 11, a width of 0.3 mm, a length of 0.6 mm, and a thickness of 0.3 mm are used. As dimensions of the amorphous wire 2, a diameter of 20 μm and a length of 0.57 mm are adopted.

A winding number of a detecting coil is set to 15, and configurations such as a width and a thickness of the detecting coil and a method for forming are the same as those in Embodiment 1.

The amorphous wire 2 having a diameter of 20 μm and a length of 0.57 mm is straightly placed on an upper surface of a planar insulating portion in a longitudinal direction as in Embodiment 1, and a liquid epoxy resin diluted with a solvent is dropped between the planar insulating portion 41 and the amorphous wire 2 to form the wire fixing portion 42. The portion along a gap between the surface of the amorphous wire 2 and the planar insulating portion 41 in the longitudinal direction is wetted with the epoxy resin, and the amorphous wire 2 is settled on the upper surface of the planar insulating portion 41 by an action of surface tension. After the settlement, the epoxy resin diluted with a solvent is baked at 100° C. for about 30 minutes to fix the amorphous wire 2 on the upper surface of the planar insulating portion 41 with the wire fixing portion 42.

Formation of the cubic insulating portion 43, the electrode 5, and the like are the same as those in Embodiment 1.

As the dimensions of the MI element configured as described above, a width of 0.3 mm and a length of 0.6 mm that are the dimensions of the substrate 11 and a thickness of about 0.33 mm obtained by summing up a thickness of 0.3 mm of the substrate 11, a diameter of 20 μm of the amorphous wire 2, the thickness of 1.5 μm of the planar insulating portion 41, the thickness of 1.5 μm of the cubic insulating portion 43, the thickness of 2 μm of the planar pattern 31 and the thickness of 2 μm of the cubic pattern 32 are set.

The characteristics of the ultra-compact MI element according to the present invention were evaluated. A pulse signal corresponding to 200 MHz and having 170 mA was input to the amorphous wire 2, and a voltage generated in the detecting coil 3 by an external magnetic field was measured.

In Embodiment 7, only a diameter of the amorphous wire in Embodiment 2 obtained by modifying Embodiment 1 is changed from 10 μm to 20 μm, the same elements and factors and the same conditions as those in Embodiment 2 are used, and an influence of the wire diameter is considered.

As the dimensions of the entire MI element according to Embodiment 7, in comparison with Embodiment 2, although a thickness is slightly increased by 0.011 mm, a thickness of 0.327 mm, a width of 0.3 mm, and a length of 0.6 mm are given, which are considerably smaller than those in a conventional technique.

A diameter of a substantial circle in Embodiment 7 is 31 μm that is larger than 19 μm in Embodiment 2. However, the proximity index n of the detecting coil is 1.6 in Embodiment 7, achieving a proximal winding in comparison with Embodiment 2 in which n=1.9.

As a result, a sensitivity of the MI element according to Embodiment 7 is 36 mV/Gauss while a sensitivity of the MI element according to Embodiment 2 is 46 mV/Gauss. The sensitivity of the MI element of this embodiment is enough to be used as a magneto-impedance sensor element.

Embodiment 8

Figure 11:
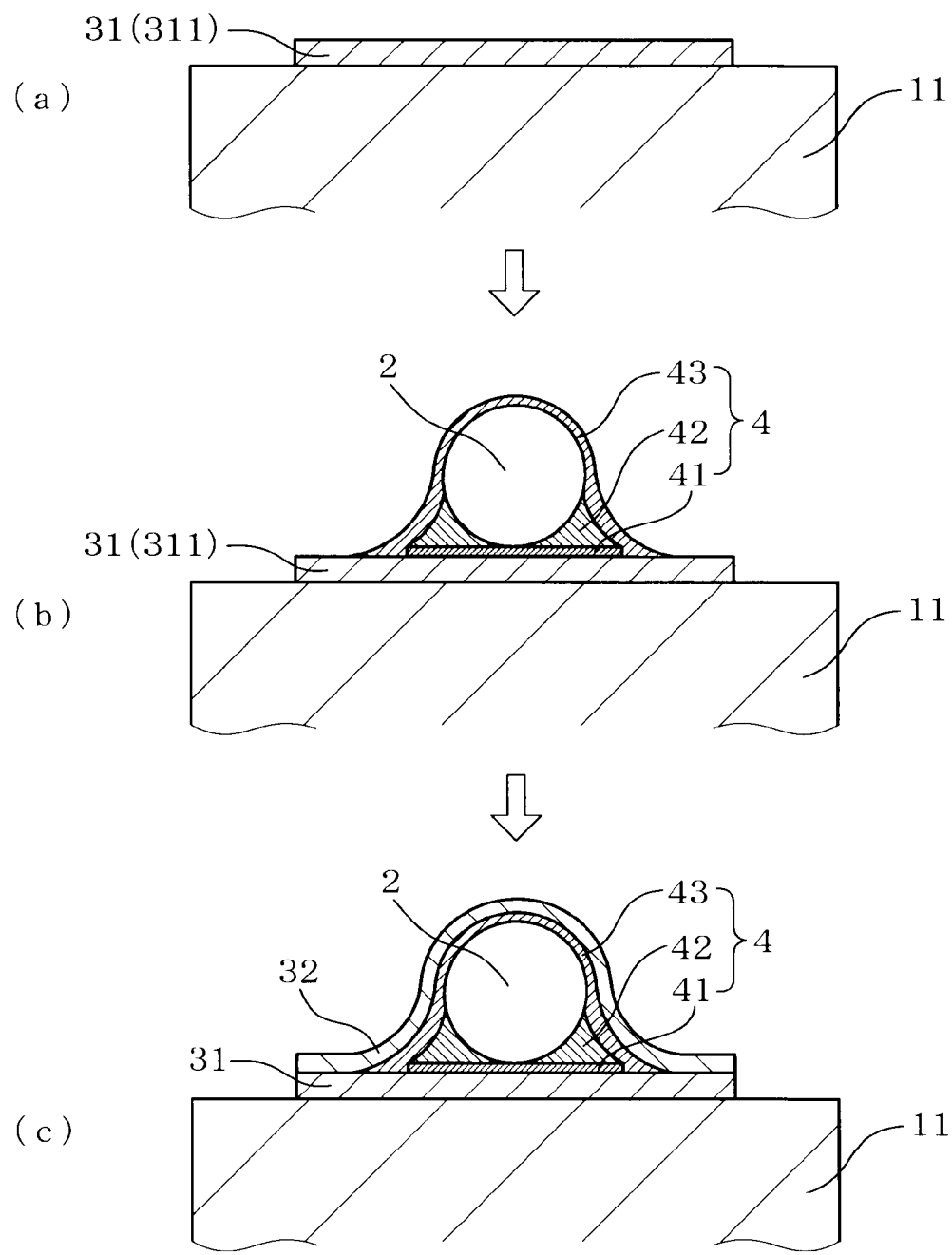
FIG. 11 is a diagram for explaining a method for manufacturing a magneto-impedance sensor element in Embodiment 8.
Figure 12:
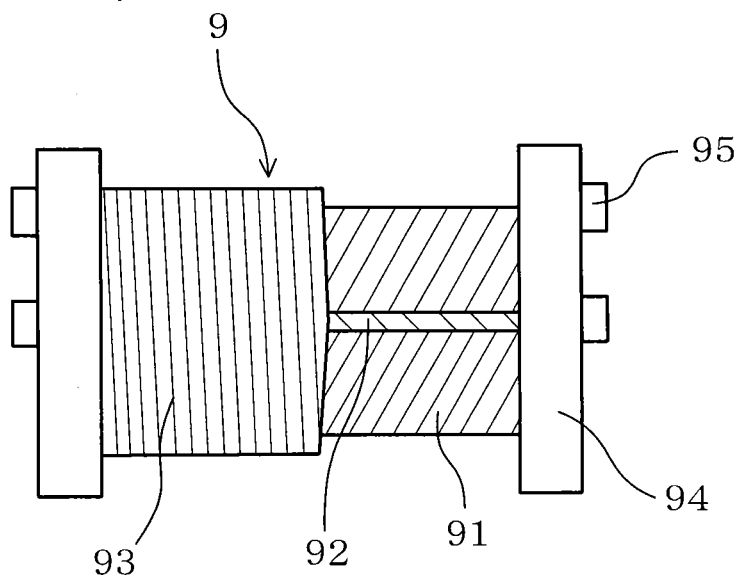
FIG. 12 shows a conventional technique (mechanical type MI element) of Patent Document 1.
Figure 13:
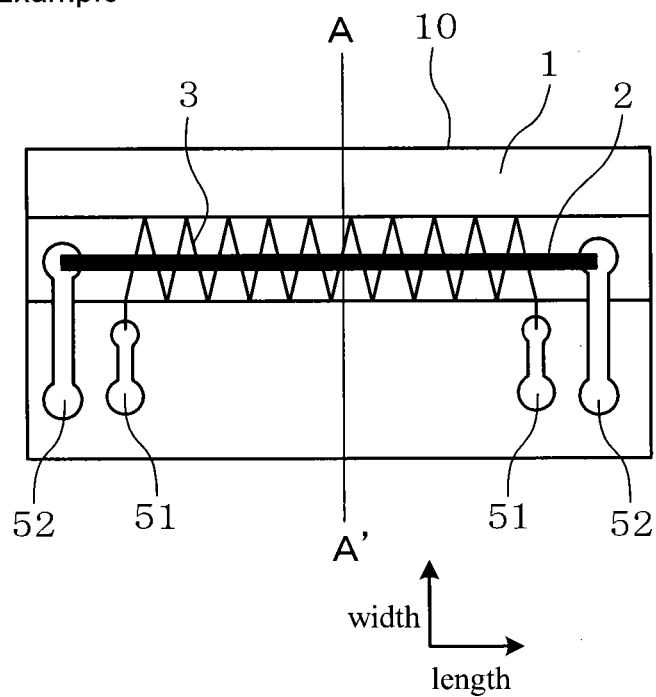
FIG. 13 is a conceptual diagram showing a front side of a conventional technique (groove type MI element) of Patent Document 2.

A method for manufacturing a magneto-impedance sensor element according to the embodiment will be described below with reference to FIG. 11.

In a method for manufacturing a magneto-impedance sensor element according to the present invention, as shown in FIG. 11(a), the step of forming a planar pattern that forms the planar pattern 31 on a flat surface of a substrate surface is performed. Thereafter, as shown in FIG. 11(b), the amorphous wire 2 is arranged on the planar pattern 31, and the step of forming the insulator 4 is performed. As shown in FIG. 11(c), the step of forming the cubic pattern 32 is performed.

In the step of forming the insulator shown in FIG. 11(b), the wire fixing portion 42 that fixes at least the amorphous wire 2 to the substrate 11 is formed such that, after the amorphous wire 2 is caused to adhere to the planar pattern 31 by using a liquid resin, the liquid resin is solidified.

According to the method for manufacturing, by using the insulator 4, the amorphous wire 2 can be fixed to the substrate surface. For this reason, an extending groove (see FIG. 14) need not be formed in the substrate 11. Therefore, a drawback such as breakage of the substrate 11 in formation of the extending groove can be prevented. Since the substrate 11 can secure sufficient strength, the substrate 11 can be reduced in thickness. Consequently, the entire sensor can be reduced in size.

Furthermore, in the step of forming the insulator 4, since the wire fixing portion 42 is formed by using a liquid resin, large stress needs not be caused to act on the amorphous wire 2. In this manner, the magnetic characteristics of the amorphous wire 2 can be prevented from being deteriorated.

In the step of forming the insulator 4, for example, the amorphous wire 2 is placed on the planar pattern 31, and the liquid resin is dropped. In this manner, the amorphous wire 2 is settled on the planar pattern 31. Thereafter, when the resin is solidified, the amorphous wire 2 is fixed on the planar pattern 31.

INDUSTRIAL APPLICABILITY

Since a planar type ultra-compact magneto-impedance sensor element according to the present invention is very small and thin and has high sensitivity, the magneto-impedance sensor element can be applied to an ultra-compact magnetic sensor for a compact electronic device represented by a cellular phone.

The invention claimed is:

1. A magneto-impedance sensor element comprising:
a substrate formed of a non-magnetic material;
a planar pattern formed of a plurality of first conductive films arranged on a flat surface of the substrate;
an amorphous wire arranged along an aligning direction of the planar pattern so as to traverse the plurality of first conductive films, the amorphous wire having a circular section perpendicular to an axis line of the amorphous wire;
an insulator that covers an outer peripheral surface of the amorphous wire and fixes the amorphous wire on the planar pattern; and
a cubic pattern that is formed over an outer surface of the insulator and a surface of the planar pattern and formed of a plurality of second conductive films arranged so as to traverse the amorphous wire, wherein
the planar pattern and the cubic pattern are formed such that a laminated junction portion obtained by jointing an end portion of the first conductive film and an end portion of the second conductive film to each other in a laminated state is formed on each of both sides of the amorphous wire on a flat surface of the substrate to form a detecting coil obtained by integrating the planar pattern and the cubic pattern around the insulator, and the insulator has a shape in which a width in a direction parallel to the planar pattern increases toward the planar pattern on a section perpendicular to an axis line of the amorphous wire.

2. The magneto-impedance sensor element according to claim 1, wherein the insulator is formed in a shape in which, when a maximum value of a width in a direction parallel to the planar pattern on a section perpendicular to an axis line of the amorphous wire and a diameter of the amorphous wire are given by L and d, respectively, L/d falls within a range of 1.3 to 5.

3. The magneto-impedance sensor element according to claim 2, wherein the L/d falls within the range of 2 to 5.

4. The magneto-impedance sensor element according to claim 1, wherein the insulator has three portions including a planar insulating portion that covers a surface of the planar pattern, a wire fixing portion that is interposed between the planar insulating portion and the amorphous wire and fixes the amorphous wire to the substrate, and a cubic insulating portion that is interposed between the amorphous wire and the cubic pattern and insulates the amorphous wire and the cubic pattern from each other, and at least the wire fixing portion is formed by using a liquid resin before the resin is solidified.

5. The magneto-impedance sensor element according to claim 4, wherein the amorphous wire has an outer peripheral surface covered with a glass coating, and the glass coating configures at least a part of the cubic insulating portion.

6. A method for manufacturing a magneto-impedance sensor element according to claim 1, comprising the steps of:
    forming the planar pattern on a flat surface of the substrate;
    arranging the amorphous wire on the planar pattern and forming the insulator; and
    forming the cubic pattern, wherein
    in the step of forming the insulator, a wire fixing portion that fixes at least the amorphous wire to the substrate is formed such that, after the amorphous wire is caused to adhere to the planar pattern by using a liquid resin, the liquid resin is solidified.

* * * * *